United States Patent [19]

Toliver et al.

[11] Patent Number: 5,049,828
[45] Date of Patent: Sep. 17, 1991

[54] METHOD AND APPARATUS FOR PARAMETER MEASUREMENT OF COUPLED-DUAL RESONATOR CRYSTALS

[75] Inventors: Samuel Toliver, Rustburg; Gerald E. Roberts, Lynchburg, both of Va.

[73] Assignee: Ericsson GE Mobile Communications Inc., Lynchburg, Va.

[21] Appl. No.: 480,773

[22] Filed: Feb. 16, 1990

[51] Int. Cl.[5] ............................................. G01R 29/22
[52] U.S. Cl. .................................... 324/727; 324/652; 324/649
[58] Field of Search ............... 324/727, 652, 653, 682, 324/719, 80, 81, 649; 29/25.35

[56] References Cited

U.S. PATENT DOCUMENTS

| | | | |
|---|---|---|---|
| 3,840,804 | 10/1974 | Sauerland | 324/727 |
| 3,992,760 | 11/1976 | Roberts | 29/25.35 |
| 4,093,914 | 6/1978 | Peppiatt et al. | 324/727 |
| 4,343,827 | 8/1982 | Thompson | 427/8 |
| 4,375,604 | 3/1983 | Vig | 310/312 |
| 4,627,379 | 12/1986 | Roberts et al. | 118/721 |
| 4,676,993 | 6/1987 | Roberts et al. | 427/10 |
| 4,725,771 | 2/1988 | Sauerland | 324/727 |
| 4,733,164 | 3/1988 | Sauerland | 324/727 |
| 4,782,281 | 11/1988 | Williamson | 324/727 |
| 4,833,430 | 5/1989 | Roberts et al. | 333/191 |
| 4,839,618 | 6/1989 | Roberts et al. | 333/191 |

OTHER PUBLICATIONS

G. E. Roberts, Proc. 33rd Ann. Symp. on Freq. Contr., "A four-frequency process for accurately measuring coupled-dual resonator crystal", May, 1979, pp. 159-165.

G. E. Roberts, IEEE Trans. on Ultrasonics, Ferroelectrics, & Freq. Control, "The four-frequency process for coupled duals using error-corrected S-parameter measurements," vol. 35, No. 3, May, 1988, pp. 306-314.

Primary Examiner—Kenneth Wieder
Assistant Examiner—Jack B. Harvey
Attorney, Agent, or Firm—Nixon & Vanderhye

[57] ABSTRACT

In coupled-dual resonator crystals, key parameters, such as resonator frequencies and synchronous peak separation frequency, are determined using a four frequency measuring process and apparatus wherein additional impedance is connected in parallel with the driving point impedance of the input resonator so as to allow the measurement of the critical frequencies above about 45 MHz.

14 Claims, 8 Drawing Sheets

AMP/PHASE RESPONSE

FIG. 10

AMP/PHASE RESPONSE

FIG. 11    AMP/PHASE RESPONSE

FIG. 12    AMP/PHASE RESPONSE

METHOD AND APPARATUS FOR PARAMETER MEASUREMENT OF COUPLED-DUAL RESONATOR CRYSTALS

CROSS-REFERENCES TO RELATED APPLICATIONS

The subject application is related to the following copending commonly-assigned U.S. patent application filed concurrently herewith: U.S. Ser. No. 07/480,774 entitled "THIRD CASE ASSOCIATED WITH THE FOUR FREQUENCY MEASURING PROCESS FOR COUPLED-DUAL RESONATOR CRYSTALS".

BACKGROUND AND SUMMARY OF THE INVENTION

The invention is generally related to monolithic coupled-dual resonator crystals and in particular is directed to a four frequency measuring process and apparatus for accurately measuring the characteristics of such crystals having relatively high frequency fundamental and overtone modes and/or relatively high resonator resistances. The exemplary embodiments disclosed are directed not only toward the accurate measuring of crystal parameters at any step of the crystal fabrication process after the resonators have been formed, but are also directed toward permitting the manufacture of precision coupled-dual resonator crystals that are operable at frequencies well above those presently available.

The general overall structure and theory of operation as well as methods for making such monolithic structures are well known as indicated in some commonly assigned generally related prior patents listed below.

U.S. Pat. No. 3,992,760—Roberts (1976)
U.S. Pat. No. 4,093,914—Peppiatt et al (1978)
U.S. Pat. No. 4,627,379—Roberts et al (1986)
U.S. Pat. No. 4,676,993—Roberts et al (1987)
U.S. Pat. No. 4,839,618—Roberts et al (1989)

A typical dual resonator crystal includes a plate of piezoelectric material having an input electrode and an output electrode on one face of the plate and a common electrode on the opposite face of the plate. A first resonator is formed by the input electrode and common electrode, and the second resonator is formed by the output electrode and the common electrode. Such dual resonator crystal filters are used extensively in electronic applications where devices having very narrow bandpass filter characteristics are desired. Although such devices are mass produced using automated techniques, control of parameters such as electrode locations, thicknesses and spacings are critical, particularly where high center frequencies are required. Such manufacturing techniques require accurate real time measurements of key coupled-dual crystal characteristics during the fabrication process and in particular in the final frequency adjust process.

As indicated in commonly assigned U.S. Pat. No. 4,093,914, accurate determination of desired characteristics such as the resonant frequency of each of the dual resonators (FA and FB) as well as the normalized center frequency of the device are desirable. Moreover, determination of "synchronous peak separation frequency" (SPSF) is indicated to be of particular significance since it provides a common reference value at a particular point in a process of manufacturing a specific crystal design such that each crystal in the group may be properly evaluated by being mathematically related to standard conditions. The key crystal parameters, including synchronous peak separation frequency, are calculated based upon four critical frequencies determined by either of two disclosed methods. Both of the disclosed methods involve obtaining the four critical frequencies by monitoring one of the two crystal ports while either shorting or effectively open circuiting the second port. The methodology taught in this commonly assigned patent to Peppiatt and Roberts is the only process known to us for accurately obtaining the critical frequencies necessary for the calculation of the key crystal parameters, such as resonator frequencies and synchronous peak separation frequency, at any step in the fabrication process after the electrodes have been formed as well as at the final test stage.

At the time that the Peppiatt and Roberts methodology was discovered, coupled-dual crystals at 21.4 MHz were the highest frequency units commonly made. At the present time, however, units at 45 MHz and 57.5 MHz are currently in production. Moreover, because of the requirements for higher and higher IF filters for cellular radios and the like with 70 MHz and 90 MHz units being used or considered in new product applications, the continued availability of an accurate measuring process for such high frequency coupled-dual resonator crystals is vitally important for measuring crystal characteristics and for producing precision units.

Briefly stated, we have discovered that as the desired fundamental or overtone operating frequencies of such crystal structures increase and/or the effective resonator resistances increase, the measured phase excursions below the zero reference diminish and eventually fail to cross the zero reference. We have additionally discovered that where one of the resonator frequencies (FA, for example) is much lower than that of the other resonator frequency (FB), two of the measured frequencies (F1 and F2) will be markedly higher in amplitude than the other two and the latter may not exhibit excursions below the zero reference.

Since such zero crossings are necessary for accurate frequency measurements, compensating circuitry is required in order to establish these reference points in the Peppiatt and Roberts transmission measurement system when applied to high frequency and/or high resonator resistance crystal filters to thereby produce accurate and precise measured results. Such compensation not only solves the problem of obtaining zero phase crossing points under the noted conditions, but also solves the basic problem of how to accurately measure the parameters of coupled-dual resonator crystals at any step during the manufacturing process following the formation of the resonators where the selected crystal design previously would have prevented obtaining such measurements.

BRIEF DESCRIPTION OF THE DRAWINGS

These as well as other objects and advantages of this invention will be more clearly appreciated by carefully studying the following detailed description of a presently preferred exemplary embodiment of this invention in conjunction with the accompanying drawings in which.

DETAILED DESCRIPTION OF THE DRAWINGS

Figure 1:
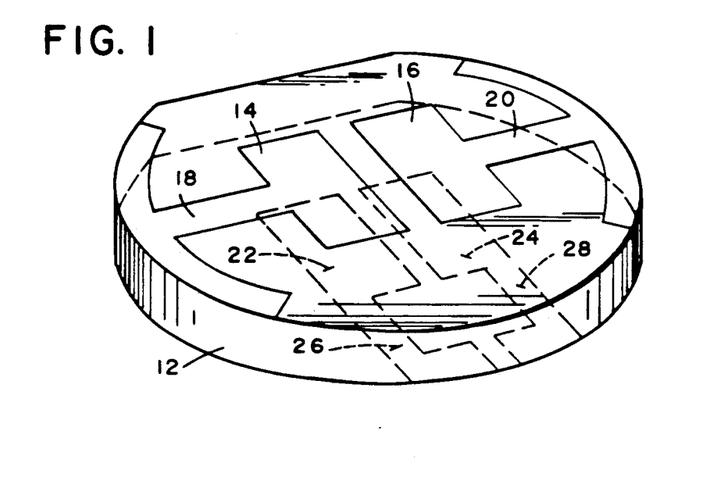
FIG. 1 is a perspective view of a coupled-dual resonator crystal.
Figure 2A:
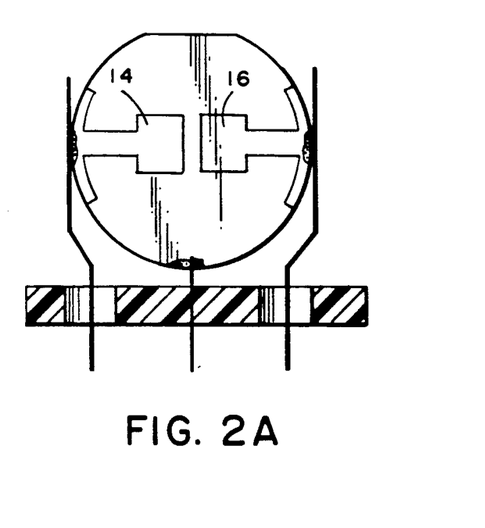
FIGS. 2A and 2B show the active and ground sides of a mounted crystal.
Figure 2B:
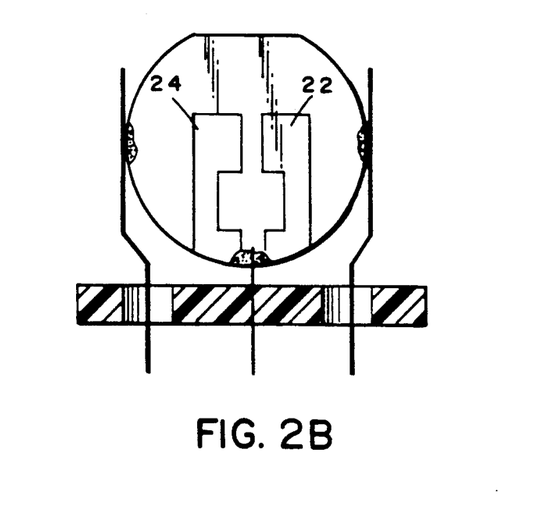

Typically a coupled-dual resonator crystal in its simplest form is constructed in a manner generally shown in FIGS. 1, 2A and 2B. Such crystal structure includes an input and an output resonator each formed by a pair of thin film electrodes (14 and 22, 16 and 24, respectively) deposited on opposite sides of a piezoelectric wafer (12) with electrical connections to the electrodes being made by way of leads 18, 20, 26 and 28. Although rectangular electrodes are illustrated, circular and semicircular electrodes, for example, may also be used.

Initial nominal electrode dimensions in such structures are conventionally obtained through the use of precision masking techniques or laser machining operations as explained in commonly assigned U.S. Pat. No. 4,839,618. Subsequent measuring and manufacturing steps are performed leading to the last operation prior to sealing, namely, the final frequency adjustment process. This last operation is extremely critical since the two resonator frequencies (FA and FB) and the synchronous peak separation frequency (SPSF), as defined in commonly assigned U.S. Pat. No. 4,093,914, must be precisely controlled in order to obtain a coupled-dual resonator crystal of desired characteristics. Such criticality is even further heightened where the desired characteristics include those required for use in a high quality mobile radio IF filter with operating frequencies above about 45 MHz, for example, or with one or both effective resonator resistance values sufficiently large as compared to the effective resonator reactances. That is to say, such criticality exists any time that the combination of motional resistance and reactance for a mode of vibration is such that one or both voltage maximums associated with the driving-point impedance would fail to cross zero phase when using the conventional approach of the 4,093,914 patent.

Figure 3:
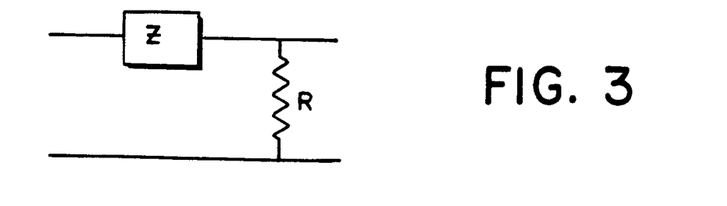
FIG. 3 illustrates a voltage divider network by which the frequencies of FIGS. 5A and 5B are displayed wherein the driving point impedance whose zeros are to be measured is put in the series arm.
Figure 5A:
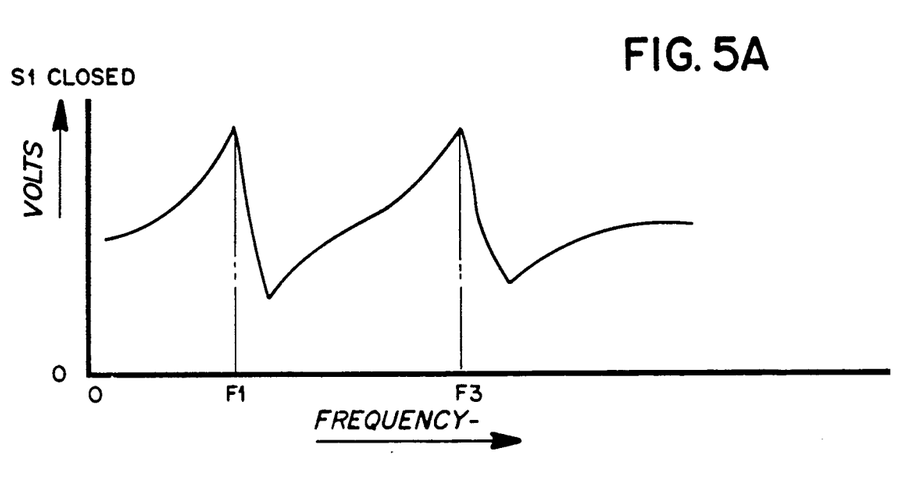
FIGS. 5A and 5B are typical responses for crystal structures under test conditions produced by the apparatus of FIG. 4.
Figure 5B:
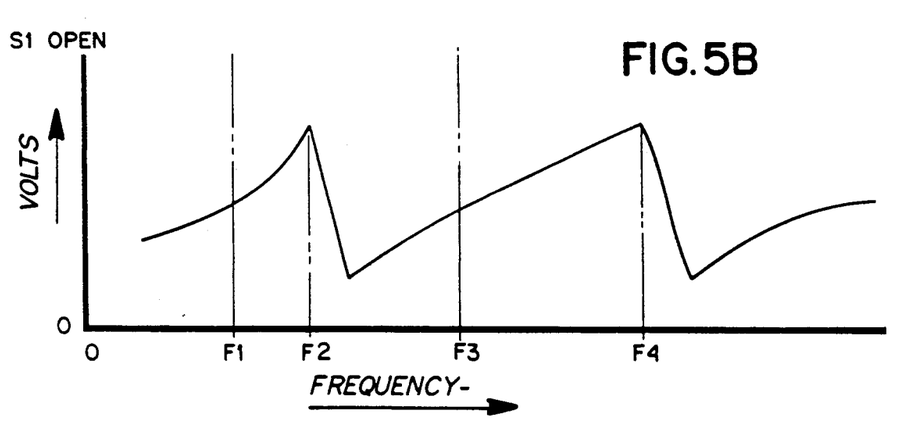

As indicated in the Peppiatt and Roberts patent, the key crystal parameters may be calculated from the four measured frequencies illustrated here in FIGS. 5A and 5B. The calculation methods disclosed in U.S. Pat. No. 4,093,914 are hereby incorporated by reference. These frequencies may be displayed by way of a simple voltage divider network as illustrated in FIG. 3 in which the driving point impedance whose zeros are to be measured is put in the series arm.

Figure 4:
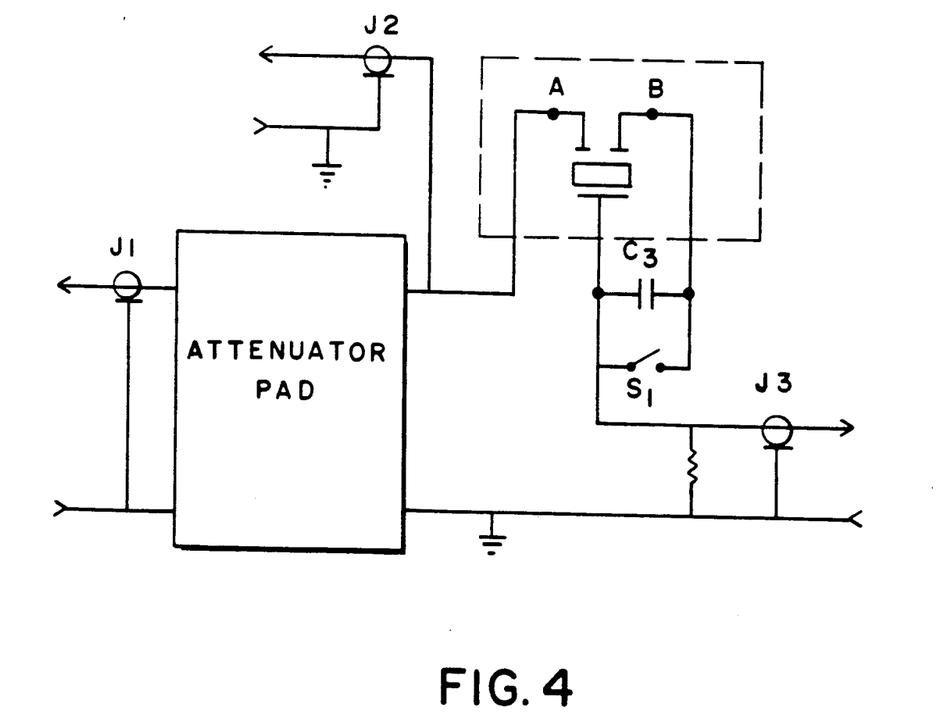
FIG. 4 is a electrical circuit diagram of apparatus for measuring parameters of coupled-dual resonator crystals.
Figure 6A:
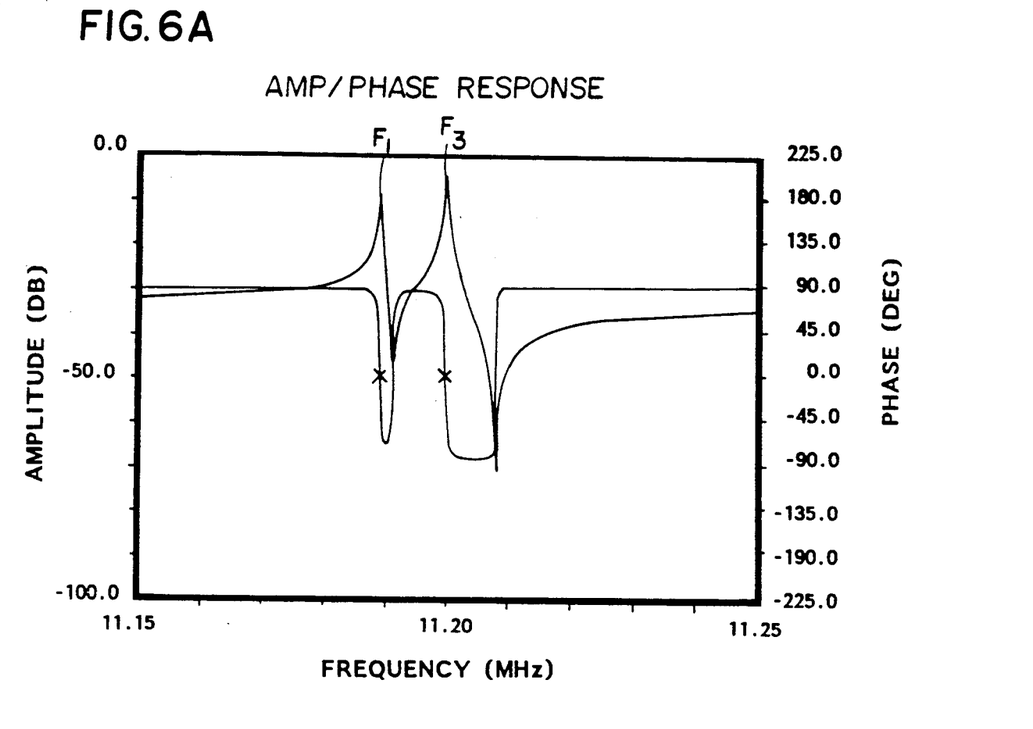
FIGS. 6A through FIG. 6E are responses similar to that which is illustrated in FIG. 5A but with the phase additionally illustrated.
Figure 6B:
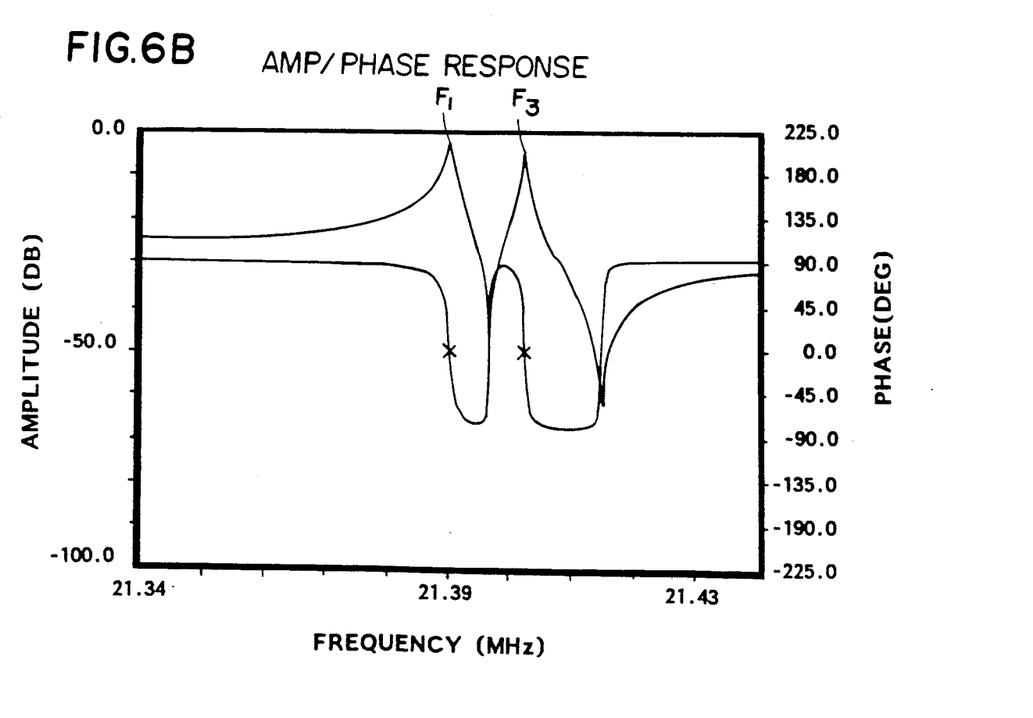

More specifically, the frequencies F1 through F4 are measured using a circuit as illustrated in FIG. 4 with a frequency synthesizer connected at J1 and the A and B probes of a vector voltmeter connected to J2 and J3, respectively. Frequencies F2 and F4 are obtained when the A side of the coupled-dual resonator is driven by a frequency synthesizer with the B side effectively open circuited. Frequencies F1 and F3 are obtained in a similar manner but with the B side short circuited. Thereafter, key crystal parameters such as resonator frequencies (FA and FB), normalized center frequency (NCF) as well as the synchronous peak separation frequency (SPSF) may be calculated using the F1 to F4 frequencies and the equations taught in the Peppiatt and Roberts patent.

Where the fundamental modes of such crystal structures operate below about 45 MHz, the resonator resistances are usually (albeit not always) relatively low resulting in a quite steep phase response slope very near the frequencies to be measured, such as F1 and F3. In FIG. 6A and 6B, for example, the amplitude and phase response for monolithic filter crystals having fundamental modes of 11.2 MHz and 21.4 MHz, respectively, are illustrated. Such responses of the A-side driving point impedance with the B-side short circuited clearly illustrate the F1 and F3 resonant frequencies as well as the large phase excursions in both positive and negative directions around zero phase. Since such zero phase crossings occur with precision with respect to frequencies F1 and F3, for example, they are monitored in transmission measurement systems for a determination of the four frequencies from which the three important crystal parameters are obtained.

Figure 6C:
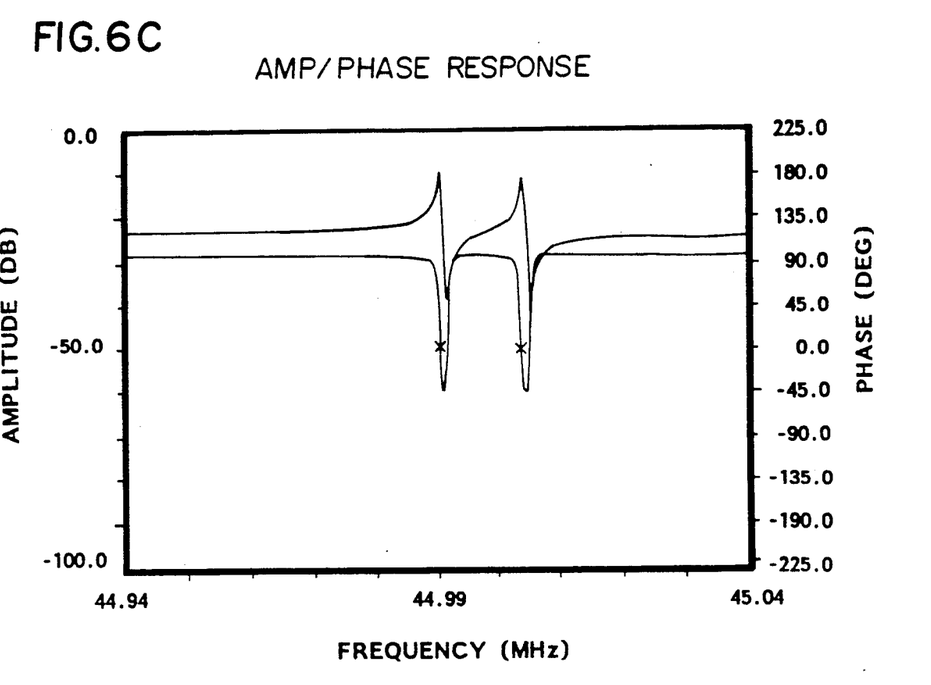
Figure 6D:
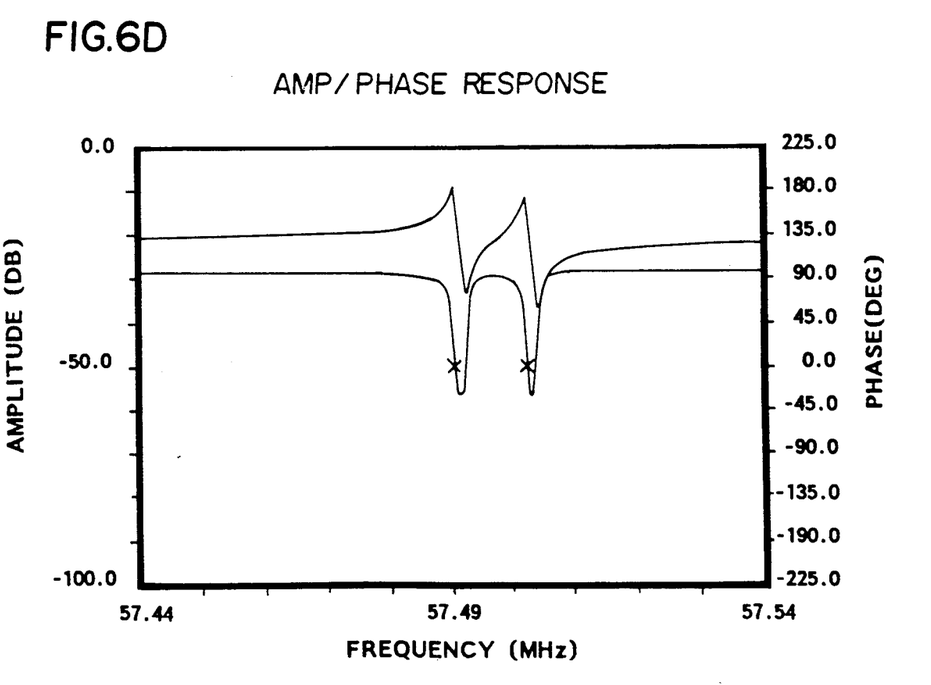
Figure 6E:
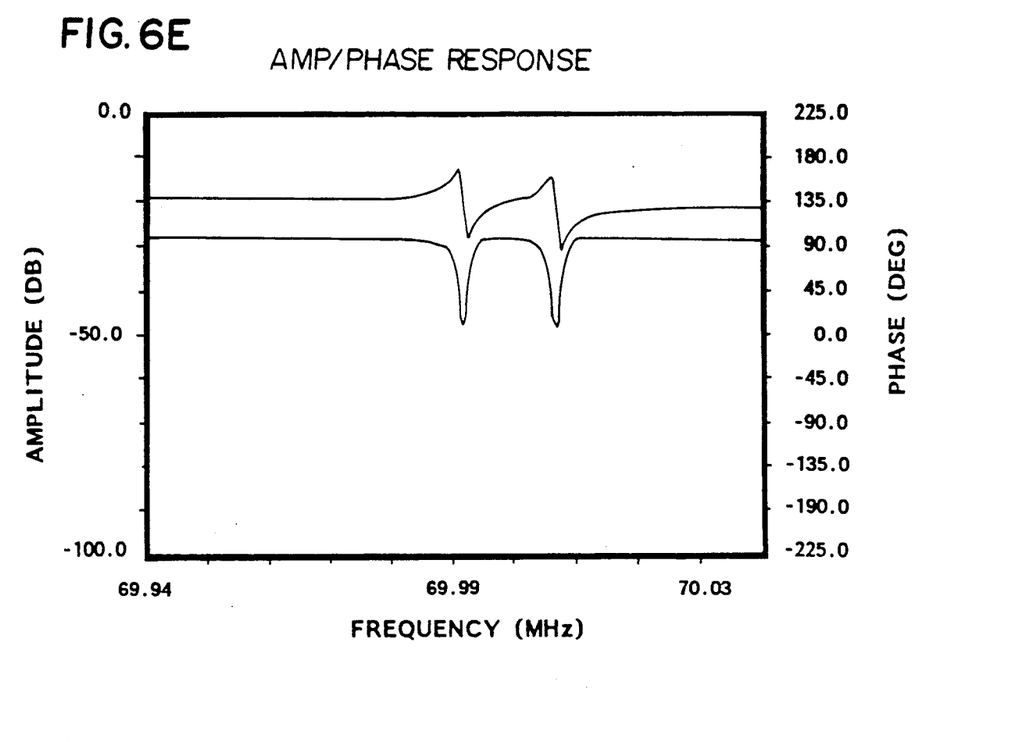

FIGS. 6C and 6D illustrate amplitude and phase responses similar to those found in FIGS. 6A and 6B but illustrating frequencies F1 and F3 for third overtone 45 MHz and third overtone 57.5 MHz coupled-dual resonator crystals. Although the phase excursions in both positive and negative directions around zero phase are present, it is clear that as the frequency of the crystal structure increases the absolute value of the phase excursion below zero reference diminishes as does the slope. Under such circumstances, the accuracy of a conventional transmission measurement system is diminished, and at still higher frequencies and/or high resonator resistance an accurate measurement cannot be made at all due to the absence of the zero phase crossings. In FIG. 6E, for example, the phase and amplitude transmission of a third overtone 70 MHz coupled-dual resonator crystal structure is illustrated as is the fact that no zero phase crossings are present. Accordingly, the critical frequencies cannot be measured using a conventional transmission system that is based upon such zero phase crossings.

Although there are normally four zero phase crossing points associated with the driving point impedance, as illustrated in FIGS. 6A and 6B, we have discovered that there appears to be two branches of the locus of the admittance function of such crystal structure and that such locus tends to move away from the real axis of a complex susceptance-conductance plot when the fundamental operating frequency of the crystal structure is increased and/or where the effective resonator resistance of such structure is high with respect to resonator reactance. The latter condition occurs more often in overtone modes, but may also occur in lower frequency fundamental mode crystals. A review of FIGS. 6C through 6E supports the conclusion that when the effective resistance of one or both resonators is sufficiently large as compared to its corresponding effective reactance, such that, the admittance locus no longer crosses the real axis and under such circumstances no zero phase points or accurate measurements of F1 to F4 will be obtained.

A still further condition has come to our attention whereby the conventional method disclosed in the 4,093,914 patent cannot be used to produce sufficiently accurate measurements of critical parameters in filter crystals. We have discovered that such a condition may occur, for example, where there is a considerable difference in resonator frequencies.

Figure 11:
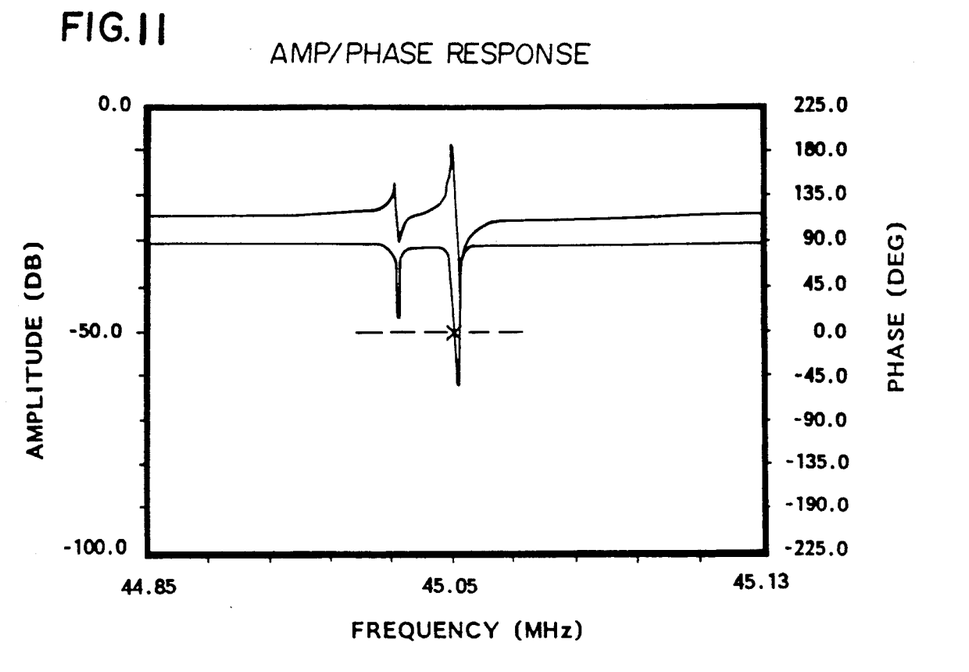
FIG. 11 shows a response similar to that found in FIGS. 6A through 6E but for a crystal design having a considerable amount of resonant frequency offset.

The skilled filter designer will at times find it necessary or advantageous to produce coupled dual resonators with a considerable offset in the frequencies of the resonators. As illustrated in FIG. 11 the phase-amplitude response of such designs will be characterized by one of the zeros of the driving point impedance having substantially higher amplitude and phase excursions relative to the other. Moreover, if the offset between the resonant frequencies FA and FB are sufficiently great, one of the amplitude peaks may not cross zero phase. For example, if FA is much lower than frequency FB, the lower frequency peaks (F1 and F2) will be markedly higher in amplitude than frequency peaks F3 and F4.

The converse would also occur. That is to say, if FA is much higher in frequency than FB, the lower frequency peaks will have a lower amplitude than the higher frequency peaks. As illustrated in FIG. 11, such conditions may result in the failure of the lower frequency peak to cross zero phase, particularly where the higher frequencies and resistances associated with overtone filter designs are involved.

Figure 7:
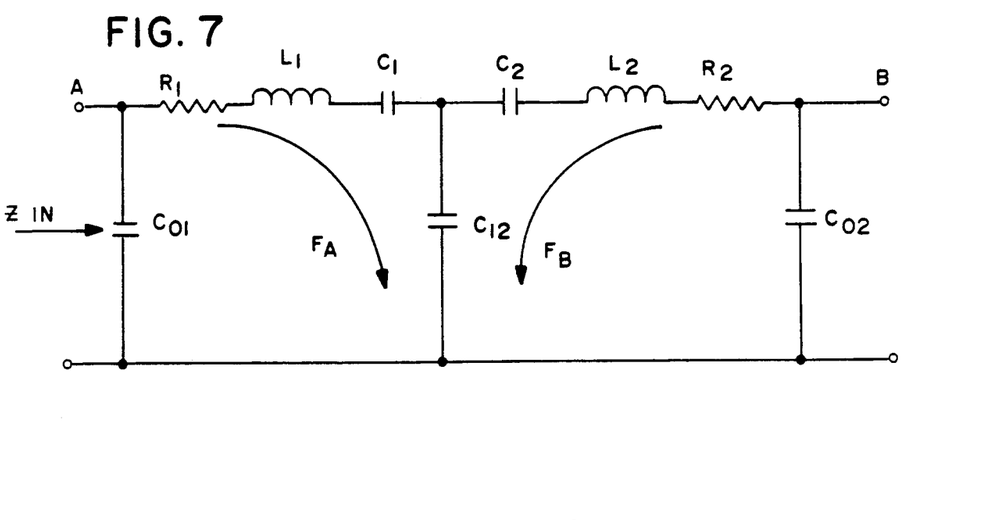
FIG. 7 is an equivalent circuit of a coupled-dual crystal.

This invention solves these problems by allowing for selective compensation of the driving point impedance such that all four peaks of the Peppiatt and Roberts patent are forced to display zero phase crossing. The solution involves using an equivalent inductance in parallel with the driving point impedance and static capacitor $C_{01}$ as illustrated in FIG. 7. Such zero phase crossing points may be established where they were previously nonexistent, because the admittance locus can be made to intercept the real axis in an appropriate manner for the measurement system contemplated.

Such problems and solutions were discovered in our efforts to produce third mode filter crystals above about 45 MHz. As previously noted, however, such problems also exist at lower frequencies where high resonator motional resistances are present. Since the solution provides for flexibility and testing accuracy in filter design, it is believed that this solution can be applied in the manufacture of all overtone filter crystals to increase yields.

Figure 8:
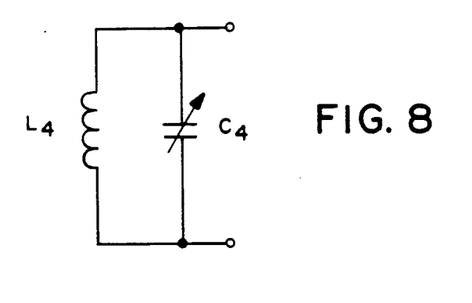
FIG. 8 is a circuit for supplying compensating reactance in a measuring system for high frequency coupled-dual crystals.

An appropriate compensating circuit is illustrated in FIG. 8 and includes the parallel combination of L4 and C4 producing a tuned inductance across the driven resonator. It has been found that the compensation circuit should be such that the effective resistance of either resonator would no longer exceed the magnitude of half the corresponding effective resonator reactance. The value of the inductance, however, is not critical so long as four zero phase frequencies exist in both the short circuit driving point impedance as well as the open circuit driving point impedance; thus allowing the measurement of frequencies F1 through F4 in high frequency coupled-dual resonator crystal structures. A variable capacitor such as a varactor is useful for spacing out the zero phase points in a convenient manner for measuring purposes.

Figure 9:
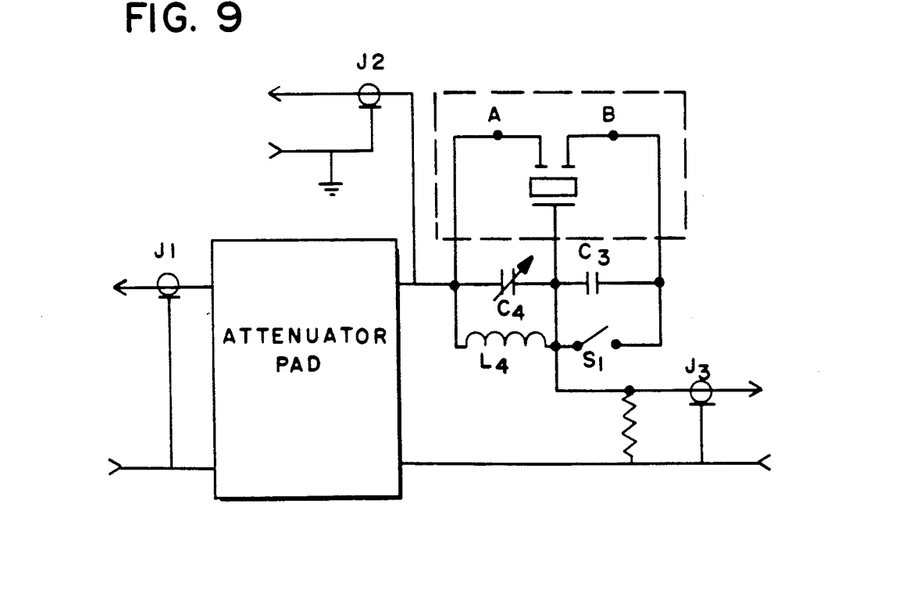
FIG. 9 is a circuit for measuring high frequency monolithic filter crystals.
Figure 10:
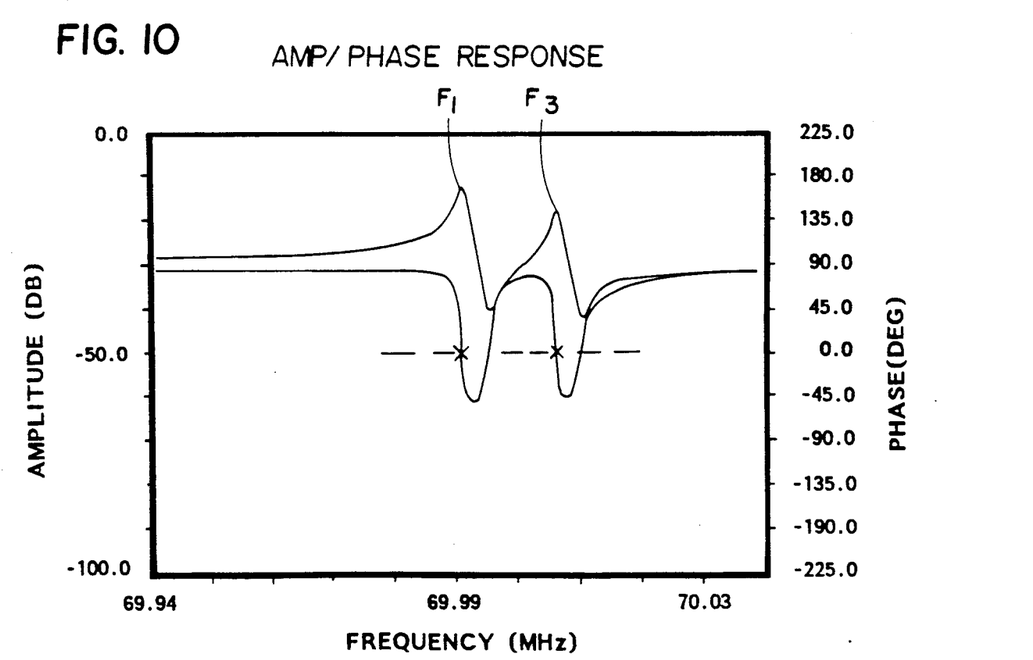
FIG. 10 is an amplitude and phase response with frequencies F1 and F3 clearly delineated by the compensation circuit induced zero phase points.

FIG. 10 illustrates the amplitude and phase excursions of a third mode 70 MHz filter crystal obtained with the compensation circuit in place as illustrated in FIG. 9. As is evident from a comparison of FIGS. 6E and 10, the inclusion of the parallel combination of L4 and C4 produces a tuned inductance for nulling out the effects of $C_{01}$ and resonator resistance in excess of its corresponding reactance such that the four zero phase frequencies for both short circuit driving point impedance and the open circuit driving point impedance may be obtained at operating frequencies not previously obtainable.

Figure 12:
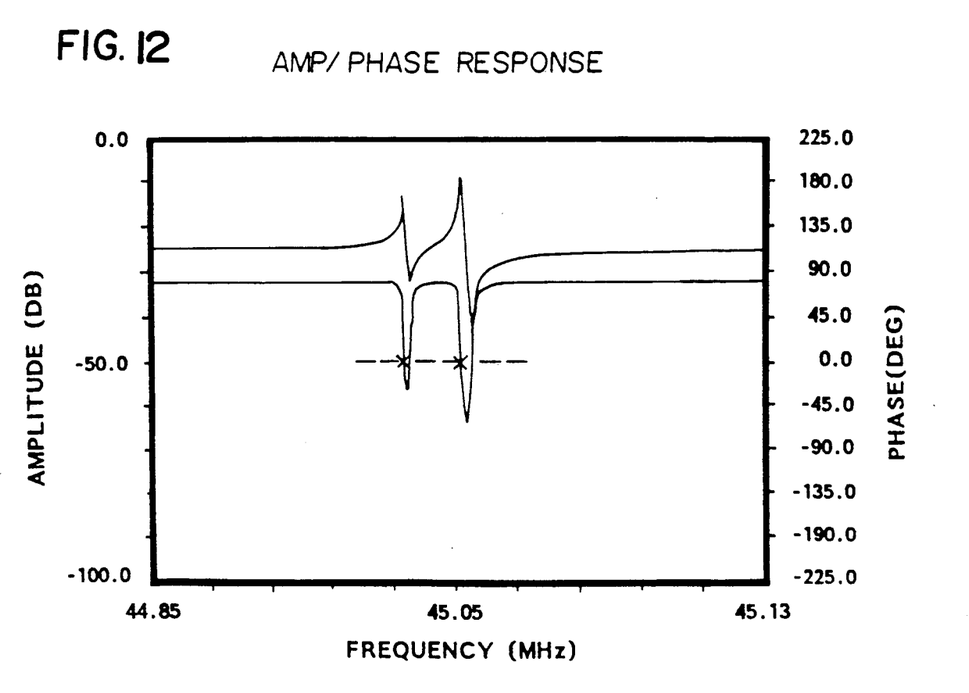
FIG. 12 shows a response similar to that illustrated in FIG. 11, but with the measuring apparatus modified to produce the required zero phase crossing.

FIG. 12 illustrates similar results obtained with the compensation circuit when applied to a third mode 45 MHz crystal filter when FB is lower than FA. Without compensation, as illustrated in FIG. 11, the lower frequency peak fails to cross zero phase, and accuracy in measuring critical crystal parameters as taught in the Peppiatt and Roberts patent is not obtained. With appropriate compensation, as illustrated in FIG. 12, zero phase crossing for the lower frequency is forced to occur, and the accuracy of the prior art method is again available for use.

In this manner we have determined not only the manner in which to obtain zero phase crossings in crystal structures having the above noted design features, but have also solved the basic problem of how to accurately measure such high frequency or relatively high resonator resistance versus reactance coupled-dual resonator crystals at any step during the manufacturing process following the formation of the resonators.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of accurately measuring selected parameters of coupled-dual resonator crystals which fail to display one or more zero phase crossing points in the phase versus frequency response of the driving-point impedance of one resonator when the other resonator is either effectively open circuited or short circuited, comprising the steps of:

connecting sufficient compensating impedance to the driving point impedance of said one resonator to force all zero phase crossing points to occur in said phase versus frequency response; and measuring the selected parameters of said crystals.

2. The method of claim 1 further comprising the step of performing the measuring of selected parameters by:

applying a band of frequencies to the input of said one resonator with the output of said other resonator short circuited, and monitoring said zero crossing points to determine the frequencies which cause the voltage at the output of said other resonator to be a maximum;

applying a band of frequencies to the input of said one resonator with the output of said other resonator effectively open circuited, and monitoring said zero crossing points to determine the frequencies which cause the voltage at the output of said other resonator to be a maximum.

3. The method of claim 1 wherein the magnitude of the effective resistance of either resonator would no longer exceed the magnitude of half the corresponding effective resonator reactance for the compensated driving point impedance.

4. The method of claim 1 wherein a frequency offset between the resonant frequencies of the uncompensated resonators is sufficiently large as to cause the failure to display one or more zero phase crossing points and connecting said compensating impedance eliminates said failure to display one or more zero phase crossing points.

5. The method of claims 1 or 2 where the connected compensating impedance includes a reactive impedance.

6. The method of claim 5 further comprising the step of tuning the reactive impedance to space the zero crossing points over a range of frequencies.

7. A method of accurately measuring characteristic frequencies of coupled-dual resonator crystals having relatively high resonator resistances or having a large resonsant frequency offset such that one or more zero phase crossing points fail to appear in the phase versus frequency response of the driving point impedance of one resonator when the other resonator is either effectively open circulated or short circuited, said method comprising the steps of:

connecting a compensating reactive impedance to the input of said one resonator said impedance being sufficient to force said one or more zero phase crossing points to appear;

applying a plurality of swept frequencies to the input of said one resonator with the output of said other resonator short circuited;

monitoring the output of said other resonator for zero phase output signals;

determining the frequencies which cause the maximum output voltages to occur at or near the zero phase signal points;

applying a plurality of swept frequencies to the input of said one resonator with the output of said other resonator open circuited or capacitively coupled;

monitoring the output of said other resonator for further zero phase output signals;

determining the frequencies which cause the maximum output voltages to occur at or near said further zero phase output signal points.

8. The method set forth in claim 7 comprising the step of:

connecting said reactive impedance such that it is in parallel with the driving point impedance of said one resonator.

9. The method as set forth in claim 8 further comprising the step of:

selecting the size of said reactive impedance so that the phase excursions in both the positive and negative directions around zero phase are sufficiently large as to insure precision monitoring of the zero phase output signals.

10. The method as set forth in claims 7 or 9 further comprising the step of:

determining key crystal parameters, including the resonator frequency of each of the resonators and the synchronous peak separation frequency, from said frequencies causing the maximum output voltages, said determining steps occurring at any time in a crystal fabrication process after the formation of said resonators.

11. An improved apparatus for accurately measuring selected parameters of high frequency coupled-dual resonator crystals having sufficiently high resonant frequency offset or resonator resistances as to fail to display one or more zero phase crossing points in a phase versus frequency response from a structure which includes a variable frequency signal generator connected to the input of one of the dual resonators and a switching element for effectively short circuiting or open circuiting the other of the dual resonators, the improvement comprising:

a tuned reactive impedance connected in parallel with the input of said one resonator;

the size of said impedance being such that the magnitude of the effective resistance of either resonator no longer exceeds the magnitude of half its corresponding resonator effective reactance, whereby the driving point impedance of said one resonator is compensated such that all zero phase crossing points are displayed in said phase versus frequency response when said other resonator is either effectively short circuited or open circuited.

12. The improved apparatus of claim 11 wherein the tuned reactive impedance includes a variable capacitor, said capacitor being used to space out said zero crossing points over a range of frequencies.

13. An apparatus for accurately measuring characteristic frequencies of a coupled-dual resonator crystal having a large resonant frequency offset or relatively high resonator resistances such that one or more zero phase crossing points fail to appear in the phase versus frequency response of the driving point impedance of one resonator when the other resonator is either effectively open circuited or short circuited, said apparatus comprising:

a compensating reactive impedance connected to the input of said one resonator said impedance being sufficient to force said one or more zero phase crossing points to appear;

a switch element and a capacitor connected in parallel with each other and with the output of the said other resonator;

a source of signals, which can be swept in frequency in a range of interest, connected to the input of the said one resonator;

whereby in a first mode of operation with said switch closed and the input side driving point impedance is displayed, the frequencies causing the maximum voltages to occur can be determined by monitoring the zero phase signal points, and in a second mode of operation with said switch open and the input side driving point impedance is displayed, additional frequencies causing the maximum voltages to occur can be determined by monitoring the zero phase signal points.

14. The apparatus of claim 13 wherein:
the magnitude of the reactive impedance is selected so that the phase excursions in both the positive and negative directions around zero phase are sufficiently large as to insure precision monitoring the zero phase output signals.

* * * * *